US010287669B2

(12) United States Patent
Chun

(10) Patent No.: US 10,287,669 B2
(45) Date of Patent: May 14, 2019

(54) MASK AND METHOD OF MANUFACTURING THE MASK

(71) Applicant: Samsung Display Co., Ltd., Yongin-si (KR)

(72) Inventor: Jiyun Chun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/157,072

(22) Filed: May 17, 2016

(65) Prior Publication Data

US 2017/0107605 A1   Apr. 20, 2017

(30) Foreign Application Priority Data

Oct. 16, 2015   (KR) ......................... 10-2015-0144824

(51) Int. Cl.
| | | |
|---|---|---|
| *B23K 26/066* | (2014.01) | |
| *B23K 26/386* | (2014.01) | |
| *B23K 26/384* | (2014.01) | |
| *C23F 1/02* | (2006.01) | |
| *C23C 14/04* | (2006.01) | |
| *B23K 26/06* | (2014.01) | |

(52) U.S. Cl.
CPC ........ *C23C 14/042* (2013.01); *B23K 26/0661* (2013.01); *B23K 26/384* (2015.10); *B23K 26/386* (2013.01); *C23F 1/02* (2013.01)

(58) Field of Classification Search
None
See application file for complete search history.

(56) References Cited

U.S. PATENT DOCUMENTS

| | | | | | |
|---|---|---|---|---|---|
| 3,398,309 | A | * | 8/1968 | Kaplan | ................... H01J 29/81 |
| | | | | | 313/402 |
| 3,707,640 | A | * | 12/1972 | Lerner | ................. H01J 29/076 |
| | | | | | 313/349 |
| 4,262,186 | A | * | 4/1981 | Provancher | ........ B23K 26/0661 |
| | | | | | 216/54 |

(Continued)

FOREIGN PATENT DOCUMENTS

| | | | |
|---|---|---|---|
| JP | 60-017837 | * | 1/1985 |
| JP | 63-079958 | * | 4/1988 |

(Continued)

OTHER PUBLICATIONS

Aric Shorey, Glass Substrates for Advanced Packaging, 3D InCites, Aug. 26, 2014.
Collimator, Feb. 24, 2016, Wikipedia.

*Primary Examiner* — Martin J Angebranndt
(74) *Attorney, Agent, or Firm* — H.C. Park & Associates, PLC

(57) ABSTRACT

A method of manufacturing a mask includes forming a first protection layer on a first surface of a mask member, the first protection layer comprising first through-holes exposing portions of the first surface; radiating, through the first through-holes, a laser beam onto the exposed portions of the first surface to form blind holes in the mask member; and providing an etchant to form second through-holes in the mask member, the second through-holes comprising the blind bores and extending from the first surface to a second surface of the mask member opposing the first surface.

7 Claims, 8 Drawing Sheets

(56) References Cited

U.S. PATENT DOCUMENTS

| | | | | |
|---|---|---|---|---|
| 4,662,984 | A * | 5/1987 | Ohtake | H01J 9/142 |
| | | | | 205/665 |
| 5,200,025 | A * | 4/1993 | Toei | C23F 1/02 |
| | | | | 216/12 |
| 5,580,466 | A * | 12/1996 | Tada | B23K 26/067 |
| | | | | 216/14 |
| 6,354,902 | B1 * | 3/2002 | Takei | H01J 9/142 |
| | | | | 445/47 |
| 2004/0135498 | A1 * | 7/2004 | Takanosu | H01L 51/0011 |
| | | | | 313/504 |
| 2011/0027461 | A1 | 2/2011 | Matsudate et al. | |
| 2014/0238963 | A1 | 8/2014 | Jo et al. | |
| 2014/0291306 | A1 | 10/2014 | Lee et al. | |
| 2015/0259780 | A1 * | 9/2015 | Mizumura | C23C 14/042 |
| | | | | 427/555 |

FOREIGN PATENT DOCUMENTS

| | | | | |
|---|---|---|---|---|
| JP | 06-228775 | * | 8/1994 | |
| JP | 07-278617 | * | 10/1995 | |
| JP | 10-319870 | * | 12/1998 | |
| JP | 11-010891 | * | 1/1999 | |
| JP | 2006-077299 | * | 3/2006 | C23F 1/08 |
| JP | 2014-133943 | * | 7/2014 | |
| KR | 10-0778540 | | 11/2007 | |
| KR | 10-0923198 | | 10/2009 | |
| KR | 10-1191557 | | 10/2012 | |
| KR | 10-2013-0037482 | | 4/2013 | |
| KR | 10-2014-0105239 | | 9/2014 | |
| KR | 10-2014-0118537 | | 10/2014 | |

* cited by examiner

MASK AND METHOD OF MANUFACTURING THE MASK

CROSS-REFERENCE TO RELATED APPLICATION

This application claims priority from and the benefit of Korean Patent Application No. 10-2015-0144824, filed on Oct. 16, 2015, which is hereby incorporated by reference for all purposes as if fully set forth herein.

BACKGROUND

Field

Exemplary embodiments relate to a mask and a method of manufacturing the mask. More particularly, exemplary embodiments relate to a mask and a method of manufacturing the mask having a high resolution pattern with reduced deformation.

Discussion of the Background

Organic light-emitting display apparatuses typically include an organic light-emitting device in a display region. The organic light-emitting device may include a pixel electrode, a counter electrode, and an intermediate layer provided between the pixel electrode and the counter electrode. The intermediate layer may include a light-emitting layer. When manufacturing such an organic light-emitting display apparatus, a variety of methods may be used to form at least a portion of the intermediate layer. For example, a deposition method using a fine metal mask (FMM) may be used; however, conventional methods to manufacture such a FMM mask have produced relatively low pattern resolutions.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a mask and a method of manufacturing the mask including a relatively high resolution pattern with reduced deformation.

Additional aspects will be set forth in part in the description which follows and, in part, will be apparent from the description, or may be learned by practice of the presented embodiments.

According to one or more exemplary embodiments, a method of manufacturing a mask includes: forming a first protection layer on a first surface of a mask member, the first protection layer comprising first through-holes exposing portions of the first surface; radiating, through the first through-holes, a laser beam onto the exposed portions of the first surface to form blind holes in the mask member; and providing an etchant to form second through-holes in the mask member, the second through-holes comprising the blind bores and extending from the first surface to a second surface of the mask member opposing the first surface.

According to one or more exemplary embodiments, a deposition mask includes: mask member comprising a first portion disposed on a second portion in a thickness direction of the mask member; and through-holes extending through the mask member. Widths of the through-holes in the first portion are different than widths of the through-holes in the second portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
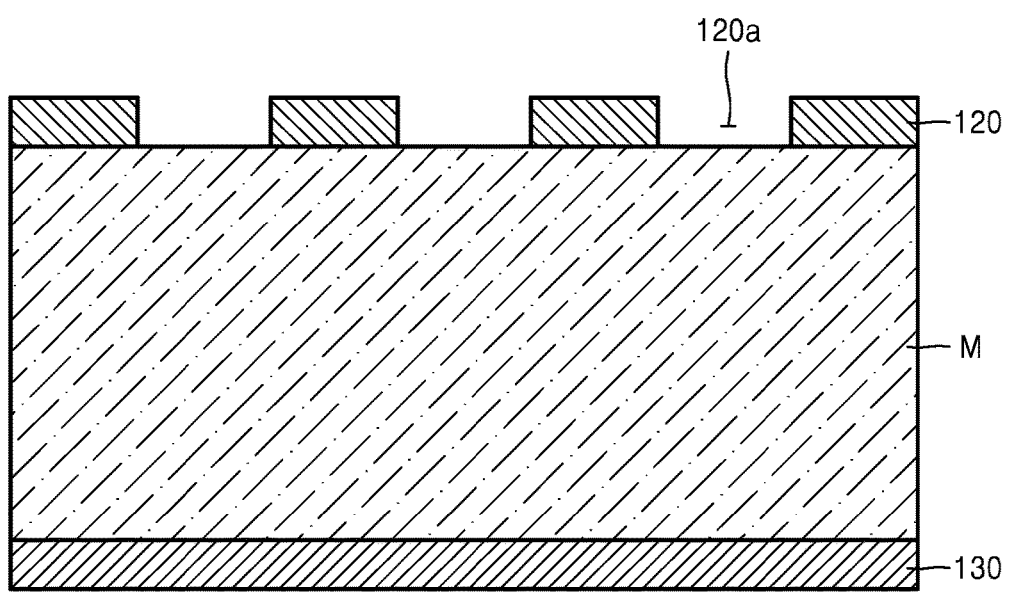
FIGS. 1, 2, 3, and 4 are schematic cross-sectional views of a mask at various stages of manufacture, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to manufacturing masks that may be utilized to fabricate an organic light emitting display device, it is contemplated that various exemplary embodiments are also applicable to semiconductor devices and display devices in general, such as, for example, liquid crystal displays, plasma displays, field emission displays, electrophoretic displays, electrowetting displays, etc.

FIGS. 1, 2, 3, and 4 are schematic cross-sectional views of a mask at various stages of manufacture, according to one or more exemplary embodiments. In this manner, FIGS. 1 to 4 will be utilized to describe a method of manufacturing the mask.

As illustrated in FIG. 1, a first protection layer 120 is formed on a first (e.g., upper) surface of a mask member M. The first protection layer 120 has a plurality of first through-holes 120a, which expose respective portions of the mask member M. The exposed portions of the mask member M will be patterned, as will become more apparent below. A second protection layer 130 may be formed on a second (e.g., lower) surface of the mask member M. In this manner, when the mask member M is dipped (or otherwise submerged) in an etching solution to etch the mask member M, the second protection layer 130 may be utilized to protect the second surface of the mask member M from the etching solution.

The first protection layer 120 and the second protection layer 130 may include a material having an etching-resistance feature that prevents etching by an etching solution. For example, the first protection layer 120 and the second protection layer 130 may include a photoresist material, however, it is contemplated that any suitable material may be utilized in association with exemplary embodiments described herein. Further, the first protection layer 120 may include the same material as the second protection layer 130.

The mask member M may include any suitable material(s). For example, the mask member M may include at least one of nickel (Ni), a nickel (Ni) alloy, a nickel (Ni)-cobalt (Co) alloy, and an iron (Fe)-nickel (Ni) alloy (i.e. invar), and the like.

Figure 2:
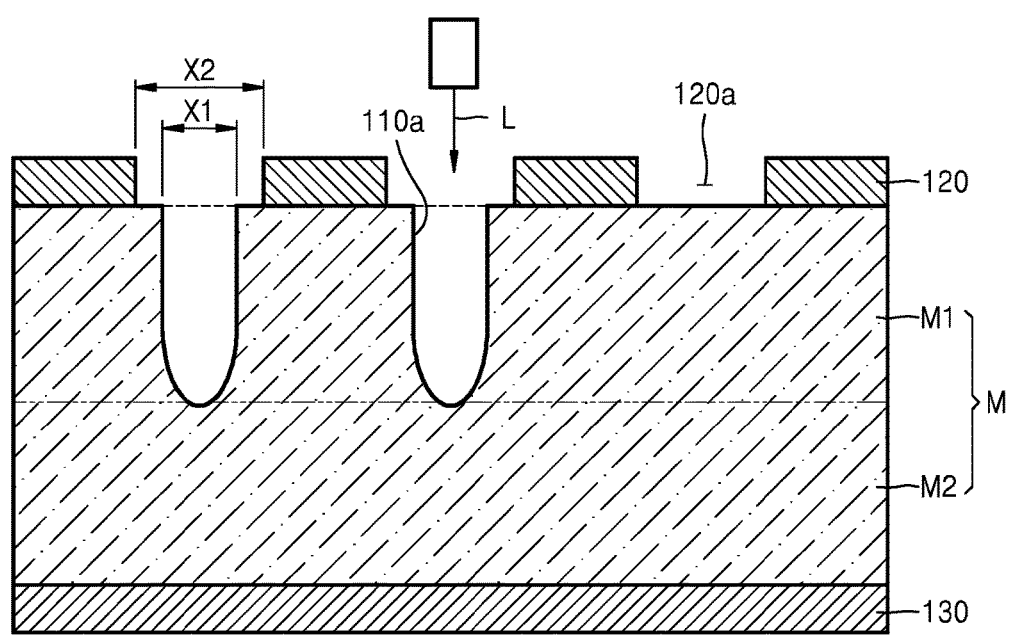

As illustrated in FIG. 2, a laser beam L may be radiated onto the first surface of the mask member M to form a plurality of holes 110a in the mask member M. The laser beam L is radiated onto the exposed portion of the first surface of the mask member M through the first through-holes 120a in the first protection layer 120. When the holes 110a are formed in the mask member M using the laser beam L, the holes 110a may be formed having a relatively fine size. Since the laser beam L transfers high temperature and high output energy to a small, localized area of the mask member M, a high resolution pattern may be easily formed in the mask member M using the laser beam L. Accordingly, since the size of an opening to be formed in a mask and a distance between the openings may be reduced, an interval between pixels in a display apparatus may be further reduced. As such, when the holes 110a are formed in a relatively fine size, a first straight (e.g., horizontal or lateral) distance X1 of each of the holes 110a in the first surface of the mask member M may be less than a second straight (e.g., horizontal or lateral) distance X2 of each of the first through-holes 120a in the first surface of the mask member M corresponding to the first straight distance X1. For instance, respective widths of holes 110a may be less than respective widths of the first through-holes 120a.

During the above-described laser processing, holes 110a are not formed through the entire thickness of the mask member M, such that the holes 110a are formed corresponding to a part of the thickness of the mask member M. In other words, the holes 110a are blind holes formed in the mask member M. The mask member M may include a first part M1 and second part M2 disposed relative to one another in a depth (or thickness) direction of the mask member M. In the mask member M, when the first part M1 denotes a portion that is processed by the laser beam L and the second part M2 denotes a portion that is not processed by the laser beam L, a first (e.g., lower) surface of each of the holes 110a formed in the mask member M may be located at an interface between the first part M1 and the second part M2. As such, given that only a portion of the mask member M is processed, thermal deformation of the mask member M by (or associated with) the laser beam L during the mask manufacturing process may be prevented or reduced.

Figure 3:
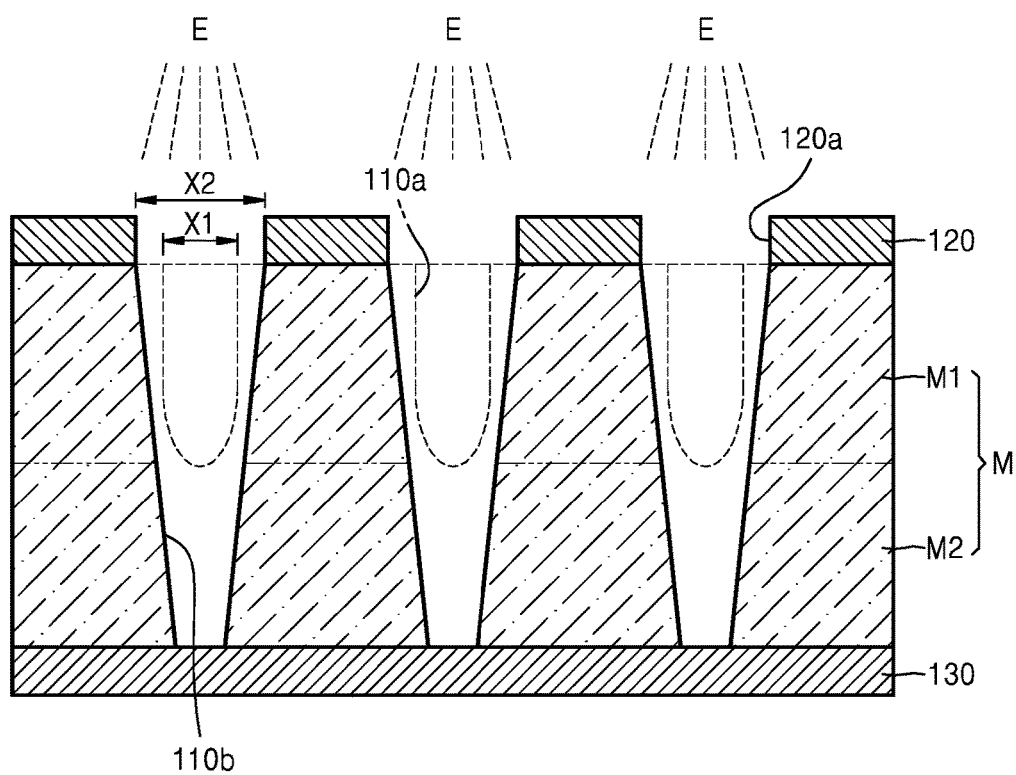

As illustrated in FIG. 3, a plurality of through-holes 110b are formed through the mask member M using an etching solution E. The etching solution E may be supplied to the holes 110a of the mask member M through the first through-holes 120a of the first protection layer 120. Accordingly, the etching solution E etches the first surface of each of the holes 110a, and, as such, the through-holes 110b are formed through the mask member M. In this manner, the second part M2 of mask member M that is not processed by the laser beam L may be etched from the first surface of each of the holes 110a to, for instance, the second surface of the mask member M. As such, through-holes that extend from the first surface of the mask member M to the second surface of the mask member M may be formed. Further, when the etching solution E is supplied, a periphery portion of the holes 110a exposed by the first through-holes 120a may be etched away, and, as such, each of the holes 110a may be widened. For example, as shown in FIG. 3, the holes 110a that were previously formed in the mask member M are transformed into the through-holes 110b. For illustrative convenience, holes 110a are illustrated in a dotted-line to provide a comparison between holes 110a and through-holes 110b.

As the etching solution E is supplied through the first through-holes 120a of the first protection layer 120, the shape of each of the through-holes 110b in the first surface of the mask member M may correspond to the shape of each of the first through-holes 120a in the first protection layer 120. Each of the first through-holes 120a of the first protection layer 120 may have various shapes. For example, the shape of each of the first through-holes 120a may be a rectangle, a diamond, a circle, an oval, etc. It is contemplated, however, that the shapes of the first through-holes 120a may be different from at least another one of the first through-holes 120a. Further, as the etching solution E moves from the first surface of the mask member M to the second surface of the mask member M, a width of each of the through-holes 110b in a direction toward the second surface of the mask member M (e.g., a downward direction) may become smaller than a width of each of the through-holes 110b in a direction toward the first surface of the mask member M (e.g., an upward direction). In other words, the width of the through-holes 110b may decrease with increasing distance from the first surface of the mask member M.

As such, when the shape of each of the through-holes 110b is a circle when viewed in a plan view, an inner surface of each of the through-holes 110b may have a taper shape when viewed in a cross-sectional view.

Figure 4:
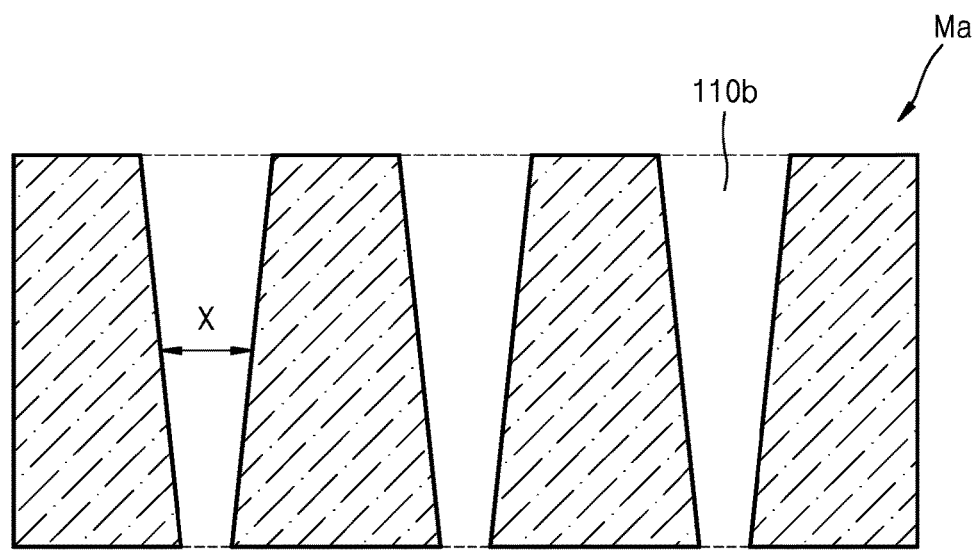

Adverting to FIG. 4, the first protection layer 120 and the second protection layer 130 are respectively removed from the first surface and the second surface of the mask member M, thereby forming a mask Ma having a plurality of the through-holes 110b. The first protection layer 120 and the second protection layer 130 may be simultaneously removed, however, it is contemplated that the first protection layer 120 and the second protection layer 130 may be removed in separate processes. The through-holes 110b may correspond to openings through which a deposition material passes when a deposition process using the mask Ma is performed. A width X of each of the through-holes 110b may decrease from a first (e.g., upper) surface of the mask Ma to a second (e.g., lower) surface of the mask Ma.

Figure 5:
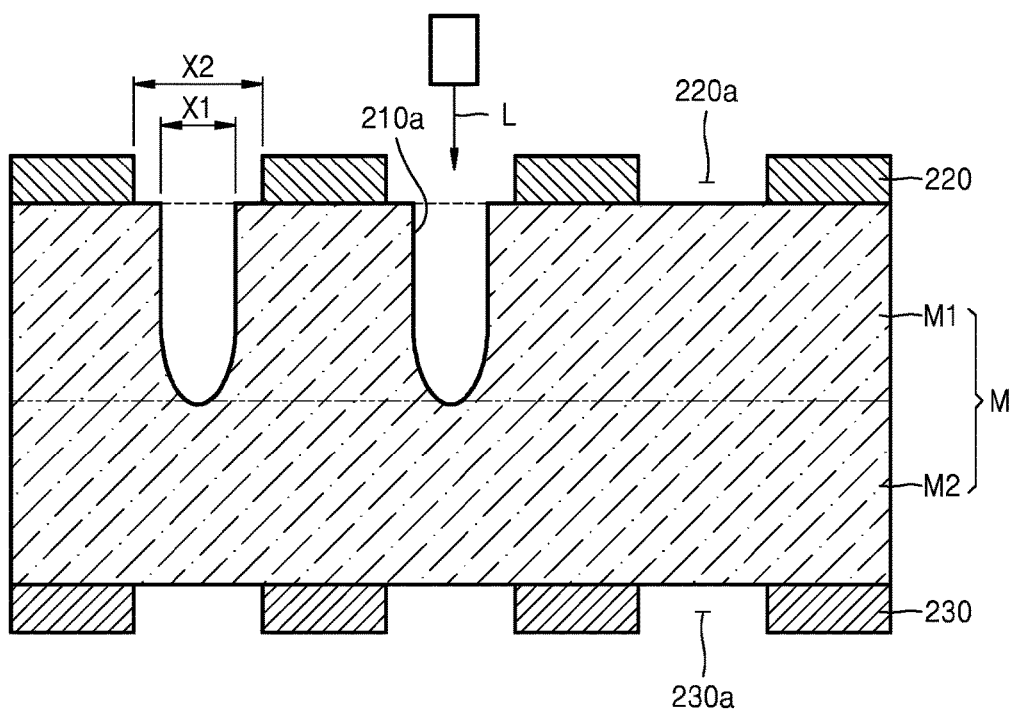
FIGS. 5, 6, and 7 are schematic cross-sectional views of a mask at various stages of manufacture, according to one or more exemplary embodiments.
Figure 6:
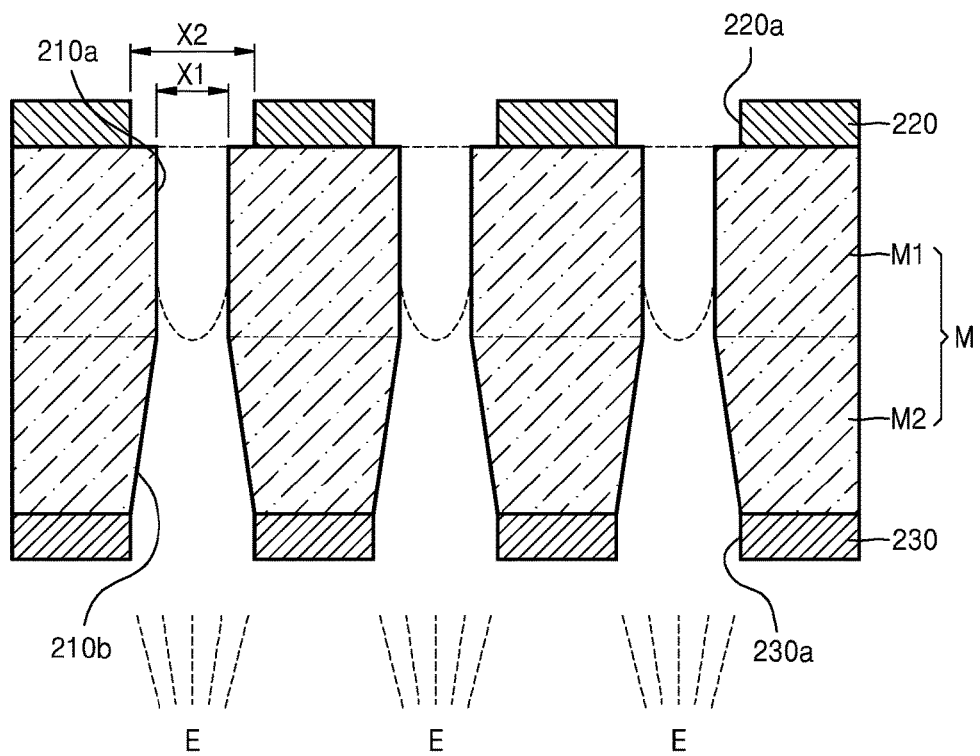
Figure 7:
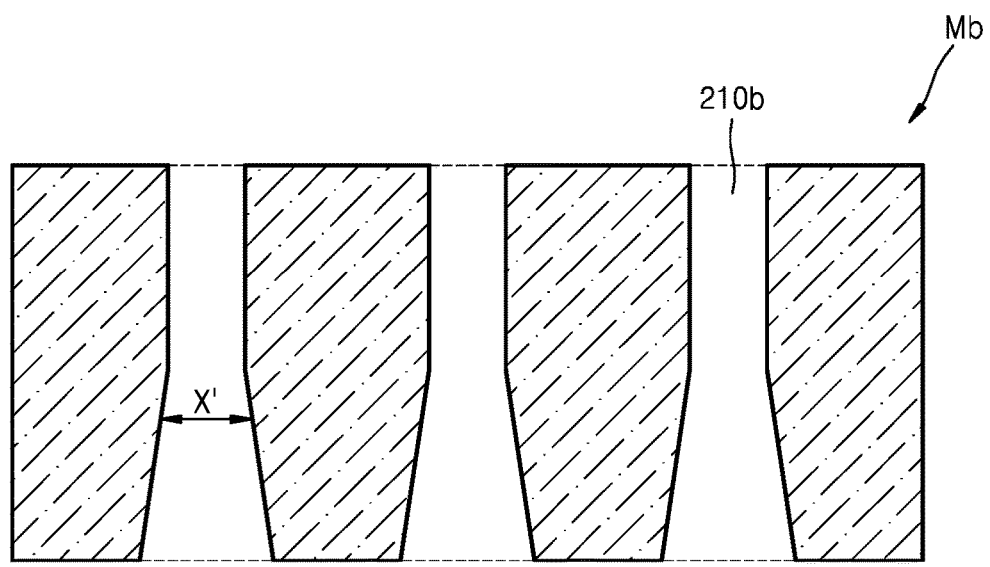

FIGS. 5, 6, and 7 are schematic cross-sectional views of a mask at various stages of manufacture, according to one or more exemplary embodiments. FIGS. 5 to 7 will be utilized to describe a method of manufacturing a mask that may be similar to the process described in association with FIGS. 1 to 4. As such, duplicative descriptions will be omitted or briefly presented to avoid obscuring exemplary embodiments described herein.

Turning to FIG. 5, a first protection layer 220 is formed on the first surface of the mask member M. The first protection layer 220 includes a plurality of first through-holes 220a. An exposed portion of the mask member M exposed by the first through-holes 220a will be later patterned, as will become more apparent below. A second protection layer 230 is formed on the lower surface of the mask member M. The second protection layer 230 includes a plurality of second through-holes 230a, which may be the same as or similar to the first through-holes 220a formed in the first protection layer 220. In this manner, the second protection layer 230 may be used not only for protecting the mask member M from an etching solution, but also for patterning the mask member M like performed in association with the first protection layer 220. It is noted that the first through-holes 220a may be, when viewed in a plan view, concentrically aligned with the second through-holes 230a. Furthermore, sizes of the first through-holes 220a and the second through-holes 230a may be similar to one another.

A plurality of holes 210a may be formed in the mask member M by radiating a laser beam L onto the first surface of the mask member M. The laser beam L may be radiated onto the exposed portion of the first surface of the mask member M through the first through-holes 220a of the first protection layer 220. When the holes 210a are formed in the mask member M using the laser beam L, the holes 210a may be formed having a relatively fine size. As such, when the holes 210a are formed having such a relatively fine size, a first straight (e.g., horizontal or lateral) distance X1 of each of the holes 210a in the first surface of the mask member M may be less than a second straight (e.g., horizontal or lateral) distance X2 of each of the first through-holes 220a in the first surface of the mask member M corresponding to the first straight distance X1. For instance, respective widths of holes 210a may be less than respective widths of the first through-holes 220a.

During the above-described laser processing, holes 220a are not formed through the entire thickness of the mask member M, such that the holes 210a are formed corresponding to a part of the thickness of the mask member M. In other words, the holes 110*a* are blind holes formed in the mask member M. In the mask member M, when the first part M1 denotes a portion that is processed by the laser beam L and the second part M2 denotes a portion that is not processed by the laser beam L, a first (e.g., lower) surface of each of the holes 210*a* formed in the mask member M may be located at an interface between the first part M1 and the second part M2. As such, given that only a portion of the mask member M is processed, thermal deformation of the mask member M by (or associated with) the laser beam L during the mask manufacturing process may be prevented or reduced.

With reference to FIG. 6, a plurality of through-holes 210*b* are formed through the mask member M using an etching solution E. The etching solution E may be supplied to the second surface of the mask member M through the second through-holes 230*a* of the second protection layer 230. Accordingly, the first surface of each of the holes 210*a* is etched away by the etching solution E being supplied from the second surface of the mask member M exposed by the second through-holes 230*a*. As such, in the second part M2 that is not processed by the laser beam L, etching is performed from the second surface of the mask member M to the first surface of each of the holes 210*a*, and, thus, a through-hole extending from the first surface of the mask member M to the second surface of the mask member M is formed. Accordingly, the holes 210*a* that were previously formed in the mask member M are transformed into the through-holes 210*b*. Although the inner surface of each of the holes 210*a* may be slightly extended by being exposed to the etching solution E, the shape formed by the laser beam L may be at least partially maintained unlike as described in association with FIGS. 1 to 4.

As the etching solution E is supplied through the second through-holes 230*a* of the second protection layer 230, the shape of each of the through-holes 210*b* in the second surface of the mask member M may correspond to the shape of each of the second through-holes 230*a* of the second protection layer 230. The second through-holes 230*a* of the second protection layer 230 may have various shapes. For example, the second through-holes 230*a* may have various shapes such as a rectangle, a diamond, a circle, an oval, etc. Furthermore, as the etching solution E moves from the second surface of the mask member M to the first surface of the mask member M, at least in the second part M2 of the mask member M, a width of each of the through-holes 210*b* in a direction toward the second surface of the mask member M (e.g., a downward direction) may be larger than a width of each of the through-holes 210*b* in a direction toward the first surface of the mask member M (e.g., an upward direction). In other words, the width of the through-holes 210*b* may increase with increasing distance from an interface between the first part M1 and the second part M2 towards the second surface of the mask member M. For example, when the shape of each of the through-holes 210*b* is a circle when viewed in a plan view, an inner surface of each of the through-holes 210*b* may have a taper shape when viewed in a cross-sectional view.

Adverting to FIG. 7, the first protection layer 220 and the second protection layer 230 are respectively removed from the first surface and the second surface of the mask member M, thereby forming a mask Mb having the through-holes 210*b*. The first protection layer 220 and the second protection layer 230 may be simultaneously removed or removed in one or more different processes. The through-holes 210*b* may correspond to openings through which a deposition material passes when a deposition process using the mask Mb is performed. A width X' of each of the through-holes 210*b* may increase from the first surface of the mask Mb to the second surface of the mask Mb, at least in a lower portion of the mask Mb. The lower portion of the mask Mb may correspond to the second part M2 of the mask member M in FIG. 6.

Figure 8:
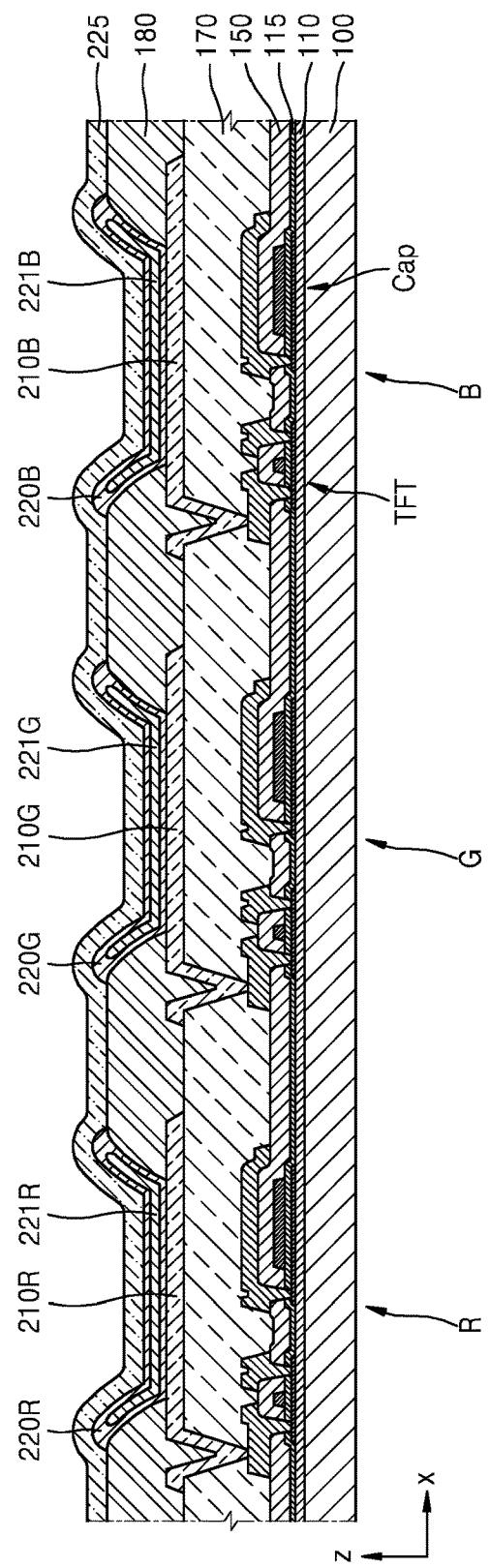
FIG. 8 is a cross-sectional view of a display apparatus manufactured using a mask, according to one or more exemplary embodiments.

FIG. 8 is a cross-sectional view of a display apparatus manufactured using a mask, according to one or more exemplary embodiments. Although a mask according to an exemplary embodiment may be variously used during a process of manufacturing a display apparatus, for descriptive convenience, an example in which the mask is used for depositing an organic light-emitting layer of an organic light-emitting display apparatus is mainly described.

As seen in FIG. 8, the display apparatus may include a substrate 100; first electrodes 210R, 210G, and 210B formed on the substrate 100; a pixel-defining layer 180 formed to expose at least a portion of the first electrodes 210R, 210G, and 210B including center portions of the first electrodes 210R, 210G, and 210B; intermediate layers 220R, 220G, and 220B formed on the first electrodes 210R, 210G, and 210B exposed by the pixel-defining layer 180; and a second electrode 225 covering the intermediate layers 220R, 220G, and 220B and the pixel-defining layer 180.

The first electrodes 210R, 210G, and 210B may be a transparent (or translucent) electrode or a reflective electrode. The first electrodes 210R, 210G, and 210B are electrically connected to respective thin film transistors (TFTs) arranged in association with respective pixels (or sub-pixels). The pixel-defining layer 180 may define a pixel including an opening corresponding to each sub-pixel, that is, an opening to expose a center portion of each of the first electrodes 210R, 210G, and 210B, or an entire portion of each of the first electrodes 210R, 210G, and 210B.

The intermediate layers 220R, 220G, and 220B, which may include organic light-emitting layers 221R, 221G, and 221B, are formed in the openings where the first electrodes 210R, 210G, and 210B of the pixel-defining layer 180 are exposed. The organic light-emitting layers 221R, 221G, and 221B in the intermediate layers 220R, 220G, and 220B may include a relatively low molecular organic substance or a polymer organic substance. The intermediate layers 220R, 220G, and 220B may further include various function layers, such as at least one of a hole transport layer (HTL), a hole injection layer (HIL), an electron transport layer (ETL), and an electron injection layer (EIL), in addition to the organic light-emitting layer 221R, 221G, and 221B.

The organic light-emitting layer may include different materials for the respective sub-pixels. For example, as illustrated in FIG. 8, the red light-emitting layer 221R, the green light-emitting layer 221G, and the blue light-emitting layer 221B may be formed for each of a red sub-pixel R, a green sub-pixel G, and a blue sub-pixel B. To this end, when the red light-emitting layer 221R, the green light-emitting layer 221G, and the blue light-emitting layer 221B are formed, a mask according to one or more exemplary embodiments may be used. In this manner, the mask may be arranged on (or over) the first electrodes 210R, 210G, and 210B to pattern the light-emitting layer of the various different materials for each sub-pixel. A spacer, for example, may be formed on the pixel-defining layer 180 to prevent the mask from contacting a previously formed portion, such as the pixel-defining layer 180 or the intermediate layers 220R, 220G, and 220B.

A material for forming a second electrode may be coated, dotted, or deposited to cover the intermediate layers 220R, 220G, and 220B, and the pixel-defining layer 180. The second electrode 225 contacts an electrode power supply line outside a display region and receives an electric signal from the electrode power supply line. The second electrode 225 may be formed as a transparent (or translucent) electrode or a reflective electrode.

A backplane of the light emitting portions of the display apparatus may further include other various elements as necessary. For example, as illustrated in FIG. 8, a TFT or capacitor Cap may be formed on the substrate 100. The backplane may further include a buffer layer 110 formed to, for instance, prevent impurities, moisture, etc., from intruding into a semiconductor layer of a TFT, a gate insulation film 115 insulating a gate electrode and the semiconductor layer of a TFT, an interlayer insulation film 150 insulating the gate electrode, a source electrode, and a drain electrode of a TFT, and a planarization film (or layer) 170 covering the TFT. The planarization film 170 may have a roughly flat upper surface, however, it is contemplated that the planarization film 170 may be, instead, simply formed as a passivation layer with an upper surface including contours similar to a lower surface of the passivation layer.

As described above, when a deposition process is performed using a mask according to one or more exemplary embodiments, even when a distance between the pixel-defining layers, that is, a distance between pixels, is fine, a relatively high resolution pattern may be easily formed for each pixel. Furthermore, as a use of a laser beam is reduced in the process of forming a mask having a relatively fine opening, deformation or twist of the mask due to, for instance, heat build-up, transfer, etc., may be prevented. Thus, according to one or more exemplary embodiments, a method of manufacturing a mask having a relatively high resolution pattern while reducing deformation of a mask member may be implemented. The scope of the exemplary embodiments is not limited to the aforementioned effects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a mask, the method comprising:

forming a first protection layer on a first surface of a mask member and a second protection layer on a second surface of a mask member, the first protection layer comprising a plurality of first through-holes exposing portions of the first surface and a second protection layer comprising a plurality of second through-holes exposing portions of the second surface, wherein the mask member comprising a first portion disposed on a second portion in a thickness direction of the mask member;

radiating, through the plurality of first through-holes, a laser beam onto the exposed portions of the first surface to form a plurality of blind holes in the first portion of the mask member;

providing, through the plurality of second through-holes, an etchant onto the exposed portions of the second surface and etching through the second portion of the mask member to form a plurality of through-holes in the mask member; and removing the first protection layer and the second protection layer from the mask member, wherein the providing of the etchant is performed after the radiation with the laser beam, wherein no laser beam is radiated on the second surface of the mask member, and wherein the etchant is applied only to the second surface through the plurality of second through holes while the first surface is only protected by the first protection layer exposing the plurality of blind holes.

2. The method of claim 1, wherein materials of the first protection layer and the second protection layer are equivalent.

3. The method of claim 1, wherein the removing of the first and second protection layers from the mask member is performed as being simultaneous.

4. The method of claim 1, wherein:
   the first surface is an upper surface of the mask member;
   the second surface is a lower surface of the mask member; and
   the etchant is a wet etchant.

5. The method of claim 1, wherein widths of the plurality of blind holes in the first portion are different than widths of the plurality of through-holes in the second portion of the mask member.

6. The method of claim 5, wherein the widths of the plurality of blind holes in the first portion are substantially same each other.

7. The method of claim 1, wherein, in a cross-sectional view, the plurality of blind holes in the first portion comprise a non-tapered shape.

* * * * *